(12) United States Patent
Roo

(10) Patent No.: US 6,885,181 B1
(45) Date of Patent: Apr. 26, 2005

(54) CALIBRATION CIRCUIT

(75) Inventor: Pierte Roo, Mountain View, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 10/379,260

(22) Filed: Mar. 4, 2003

Related U.S. Application Data

(62) Division of application No. 09/629,095, filed on Jul. 31, 2000, now Pat. No. 6,577,114.

(51) Int. Cl.[7] .............................................. G01R 23/02
(52) U.S. Cl. .............................. 324/76.28; 324/158.1; 324/601
(58) Field of Search .......................... 324/76.28, 158.1, 324/601, 76.29; 438/14, 17, 18; 702/85, 106, 107; 327/553, 558, 552

(56) References Cited

U.S. PATENT DOCUMENTS

| | | |
|---|---|---|
| 4,570,492 A | 2/1986 | Walsh |
| 4,851,719 A | 7/1989 | Hitomi |
| 5,065,351 A | 11/1991 | Johnston et al. |
| 5,247,241 A | 9/1993 | Ueda |
| 5,506,534 A | 4/1996 | Guo et al. |
| 6,191,715 B1 | 2/2001 | Fowers |
| 6,307,442 B1 | 10/2001 | Meyer et al. |
| 6,577,114 B1 * | 6/2003 | Roo ......................... 324/76.28 |
| 6,737,851 B1 * | 5/2004 | Roo ......................... 324/76.28 |

FOREIGN PATENT DOCUMENTS

| | | |
|---|---|---|
| WO | WO 99/46867 | 9/1999 |
| WO | WO 00/27079 A1 | 5/2000 |
| WO | WO 00/28663 A3 | 5/2000 |
| WO | WO 00/28663 A2 | 5/2000 |
| WO | WO 00/28691 A3 | 5/2000 |
| WO | WO 00/28691 A2 | 5/2000 |
| WO | WO 00/35094 A1 | 6/2000 |
| WO | WO 00/46867 A1 | 8/2000 |

OTHER PUBLICATIONS

U.S. Appl. No. 09/629092, Pierte Roo, filed Jul. 31, 2000.

* cited by examiner

*Primary Examiner*—Robert Pascal
*Assistant Examiner*—Jimmy Nguyen

(57) ABSTRACT

An apparatus is provided to calibrate a target electrical circuit. The target electrical circuit includes at least a first variable capacitor and a first resistive element. The apparatus includes a second variable capacitor proportionally matched to the first variable capacitor. The apparatus also includes a measurement branch having at least a second resistive element proportionally matched to the first resistive element, and a current generator to generate a current proportionally matched to a predicted current of the target circuit. The apparatus also includes a digital loop to generate a digital code based on at least a comparison between a first voltage signal of the measurement branch and a predetermined voltage.

6 Claims, 3 Drawing Sheets

CALIBRATION CIRCUIT

CONTINUING DATA

The present application is a Divisional of pending prior application Ser. No. 09/629,095 filed on Jul. 31, 2000, now U.S. Pat. No. 6,577,114, the contents of which are incorporated herein by reference.

BACKGROUND OF THE INVENTION

1. Field of the Invention

The present invention relates generally to calibrating electrical circuits, such as signal filters. In particular, the present invention relates to an electrical calibration circuit.

2. Background and Related Art

Electrical circuits are often fabricated by processes that introduce unexpected or unwanted characteristics. Such characteristics may vary a circuit's performance from its designed specifications. External factors such as temperature can also vary the performance of a circuit.

A Sallen and Key ("SK") low pass filter is depicted schematically in FIG. 1. As will be appreciated by those skilled in the art, the illustrated SK filter provides a second-order response. As shown in FIG. 1, the SK filter includes a known 1× buffer 1, resistors $R_1$ and $R_2$, and capacitors $C_1$ and $C_2$. A straightforward analysis of the SK filter yields the following transfer function, with $R_2 = R_1$:

$$H(s) = \frac{1}{S^2 + \frac{Wp}{Q}S + Wp^2}, \quad (1)$$

where $$Wp = \frac{1}{\sqrt{R_1 R_1 C_1 C_2}}, \text{ and} \quad (2)$$

$$\frac{1}{Q} = 2\sqrt{\frac{R_1 C_2}{R_1 C_1}} = 2\sqrt{\frac{C_2}{C_1}}. \quad (3)$$

SK Filters are often employed in circuits that require precise signal responses. However, such filters are rendered ineffective if their characteristics, such as a cutoff frequency ($\omega_c$), are altered in the fabrication process. For example, a design may call for a 10 pF capacitor, but the fabricated capacitor may actually have a capacitance of 11.5 pF. Process variance is particularly problematic for integrated circuits, since integrated components are not easily calibrated.

Conventional calibration techniques, such as calibrating for a precise resistance or capacitance, are insufficient because both resistance and capacitance can vary, and the cutoff frequency ($\omega_c$) is a function of the RC product.

Hence, there are many accuracy-related problems to be solved in the art. Accordingly, an electrical calibration circuit is needed in such circuits. There is a further need for an electrical calibration circuit to calibrate signal filters. There is also a need for a calibration method to correct for fabrication variance.

SUMMARY OF THE INVENTION

The present invention is intended to overcome the drawbacks noted above and to provide an effective electrical calibration circuit. The calibration circuit can be used to calibrate integrated electrical circuits, such as filters.

According to a first aspect of the present invention, an apparatus to calibrate a target electrical circuit is provided. The target electrical circuit includes at least a first variable capacitor and a first resistive element. The apparatus includes a second variable capacitor proportionally matched to the first variable capacitor, and a measurement branch. The measurement branch has at least a second resistive element proportionally matched to the first resistive element, and a current generator to generate a current proportionally matched to a predicted current of the target circuit. The apparatus also includes a digital loop to generate a digital code based on at least a comparison between a first voltage signal of the measurement branch and a predetermined voltage.

According to another aspect of the present invention, a method of calibrating a target electrical circuit is provided. The target electrical circuit includes at least a first variable capacitor and a first resistive element. The method includes the steps of: i) matching a second variable capacitor to the first variable capacitor; ii) providing a measurement branch having at least a second resistive element proportionally matched to the first resistive element, and providing a current generator to generate a current proportionally matched to a predicted current of the target circuit; and iii) generating a digital code based on at least a comparison between a first voltage signal of the measurement branch and a predetermined voltage.

According to still another aspect of the present invention, a method of calibrating a target circuit with a calibration circuit is provided. The target circuit includes at least a first and second variable capacitor, and the calibration circuit includes at least a third variable capacitor. The method includes the steps of: i) proportionally matching components in the calibration circuit with the target circuit; ii) generating a digital code in response to a voltage change in the calibration circuit; and iii) providing the digital code to each of the three variable capacitors.

According to yet another aspect of the present invention, a calibration circuit is provided. The calibration circuit includes a first capacitor having a plurality of parallel capacitors. At least one parallel capacitor of the plurality of parallel capacitors communicates with a switch, and the switch is operated with a digital signal. The calibration circuit includes a digital loop having an output in communication with at least the switch of the one parallel capacitor. The digital loop generates a digital signal and communicates the digital signal to at least the switch. The digital signal is varied to reach a steady-state for the calibration circuit.

These and other objects, features and advantages will be apparent from the following description of the preferred embodiments of the present invention.

BRIEF DESCRIPTION OF THE DRAWINGS

The present invention will be more readily understood from a detailed description of the preferred embodiments taken in conjunction with the following figures.

DETAILED DESCRIPTION OF THE PREFERRED EMBODIMENTS

The preferred embodiments will be described with respect to a calibration circuit for calibrating a low pass filter. However, as will be appreciated by those skilled in the art, the inventive calibration circuit is also applicable to calibrating other RC circuits, such as other filters, electronic circuits, and so forth.

Figure 1:
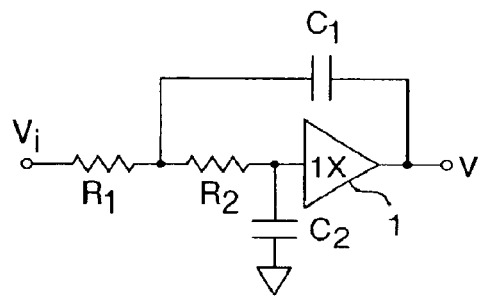
FIG. 1 is a circuit diagram illustrating a conventional Sallen and Key low pass filter.
Figure 2:
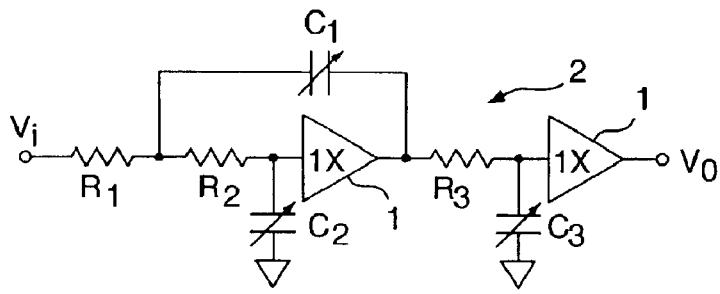
FIG. 2 is a circuit diagram of a third-order Sallen and Key low pass filter.

FIG. 2 illustrates a third-order, low pass (cascaded) filter 2 arranged in an SK configuration. As will be appreciated, a third order response is achieved by cascading a first-order filter (e.g., $R_3$ and $C_3$) with a second-order SK filter. Such a filter could be used, for example, to filter a receive signal in an Ethernet gigabit channel, as described in a co-pending application by the same inventor of this application, titled "ACTIVE RESISTIVE SUMMER FOR A TRANSFORMER HYBRID," filed on 31 Jul 2000 and assigned Ser. No. 09/629,092, and hereby incorporated by reference. Of course, the illustrated filter 2 could be used in other applications as well.

Figure 6:
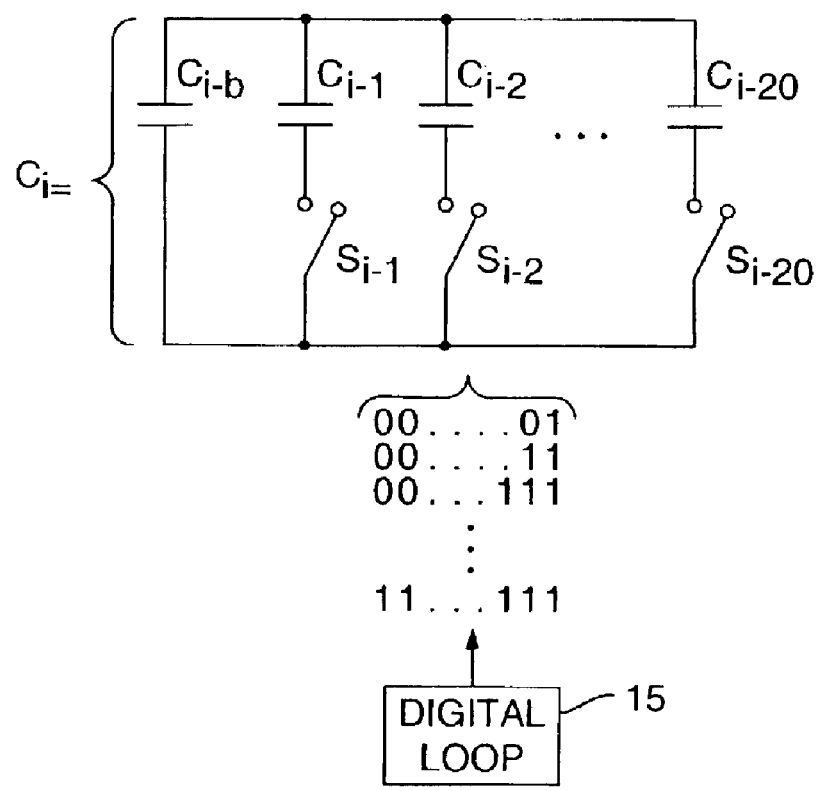
FIG. 6 is a circuit diagram illustrating a structure of a capacitor $C_1$.

The low pass filter 2 preferably includes a variable capacitor $C_1$, capacitors $C_2$ and $C_3$, and resistors $R_1$, $R_2$, and $R_3$. Capacitors $C_2$ and $C_3$ have equal capacitance in the preferred embodiment. Similarly, resistors $R_1$, $R_2$, and $R_3$ are equal (e.g., $R_1=R_2=R_3$) in the preferred embodiment. Of course, the capacitance of $C_2$ and $C_3$ respectively, as well as resistors $R_1$, $R_2$, and $R_3$, respectively, can be varied according to need or filter design. In an alternative arrangement, low pass filter 2 includes variable capacitors $C_1$, $C_2$, and $C_3$. A preferred structure for the variable capacitors is shown in FIG. 6, and is discussed in even greater detail below. Varying the capacitance of $C_1$ calibrates the low pass filter 2. In the alternative arrangement, the capacitance of $C_1$, $C_2$ and/or $C_3$ can be varied to calibrate filter 2. For the second-order SK stage of filter 2, Q is preferably equal to one (1), which yields $C_1=4C_2$, as shown by Equation 3. Preferred parameters for the SK filter 2 are shown in Table 1.

TABLE 1

Preferred Low pass Filter Parameters

| Component | Preferred Value |
|---|---|
| $R_1 = R_2 = R_3$ | 10K Ohms |
| $C_1$ | 800 fF |
| $C_2 = C_3$ | 200 fF |
| DC Gain | 1 |
| Cutoff frequency | 50 Mhz |
| Buffer Characteristics | Bandwidth = 400 MHz |

Due to fabrication or external factors, the SK filter 2 may have undesirable filtering characteristics. Calibration of the circuit will enhance the filter 2's performance and/or achieve designed specifications. Accordingly, a calibration circuit and method will be described in further detail below.

A relationship between a target circuit (e.g., the filter circuit to be calibrated) and a calibration circuit 3 is found. It will be appreciated by those skilled in the art that the current I through the $C_2$ capacitor (as shown in FIG. 2) is defined as follows:

$$I = \frac{q}{t} = \frac{C_1 \Delta V_{C1}}{\Delta t}, \quad (4)$$

where q is charge, $\Delta V_{C1}$ is the change in voltage across the $C_1$ capacitor, and $\Delta t$ is the amount of charging time. If the current I (Equation 4) flows through a measurement branch of a calibration circuit, then a voltage ($V_R$) in a measurement branch of the calibration circuit can be expressed as:

$$V_R = K_1 I R, \quad (5)$$

where $K_1$ is an arbitrary constant and R represents $R_1$, if $R_1=R_2=R_3$. Of course, the inventive techniques and resulting structures can also be achieved when $R_1$, $R_2$, and $R_3$ are not equal, with straightforward modifications that will be appreciated by those skilled in the art.

Substituting Equation 4 into Equation 5 yields Equation 6, below:

$$V_R = K_1 \frac{C_1 \Delta V_{C1} R}{\Delta t}. \quad (6)$$

A constant $K_2$ (where $K_2=K_1/\Delta t$) simplifies Equation 7 as follows:

$$V_R = K_2 \Delta V_1 C_1 R. \quad (7)$$

If $V_R = \Delta V_{C1}$, then:

$$\frac{1}{K_2} = C_1 R. \quad (8)$$

Selecting values for $C_1$ and R, based on a desired cutoff frequency, yields a value for $K_2$. A value for $K_1$ can then be found since $K_2=K_1/\Delta t$. In the preferred embodiment $K_1$ equals 15.

$K_1$ can be mapped onto the calibration circuit 3 by attributing its value to different components as follows:

$$K_1 = 15 = (C)(I)(R) = (2)(3)(2.5), \quad (9)$$

where C corresponds to $C_2$ in FIG. 2, I is a measurement current and R is the selected resistor. These values can then be mapped onto components to construct a calibration circuit 3 shown in FIG. 3. Of course, $K_1$ could be apportioned in different amounts or to different components, and the corresponding amounts and components could be adjusted accordingly.

Figure 3:
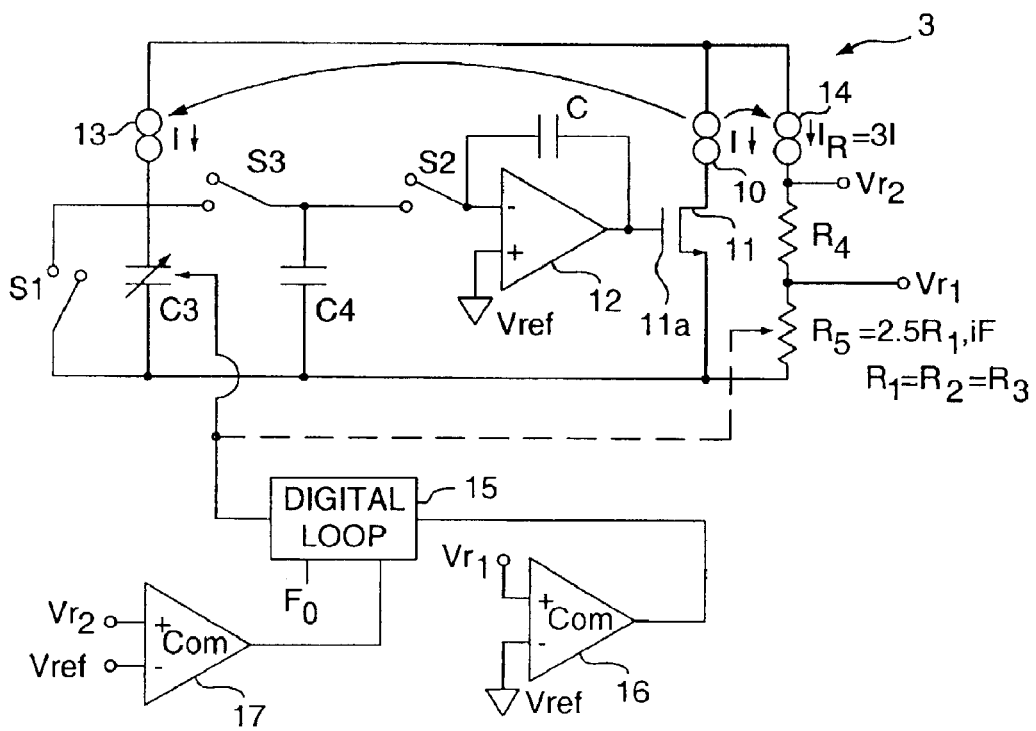
FIG. 3 is a circuit diagram of a calibration circuit according to the present invention.

Calibration circuit 3 (as shown in FIG. 3) and low pass filter 2 (as shown in FIG. 2) are preferably designed and constructed via customized CMOS integrated circuits. It is even more preferably to fabricate circuits 2 and 3 near in time, such as during the same process run (e.g., preferably on the same chip and near the same chip location). In this manner, the process tolerances and fabrication conditions will be nearly identical for each of the calibration and target (e.g., filter 2) circuit. Accordingly, component characteristics and values, such as resistor and capacitor values, can be closely matched between the two circuits 2 and 3.

A preferred calibration circuit 3 configuration is shown in FIG. 3. A known current source 10, providing a current I, is placed in series with a transistor 11. Transistor 11 can be a known transistor, such as a CMOS n-channel transistor. The output of an integrator 12 is applied to the gate 11a of the transistor 11. The integrator 12 can be constructed in a known manner. For example, an op-amp is preferably arranged in an inverting configuration by placing a capacitor C between the output terminal and the inverting (e.g., negative) terminal of the op amp. In a preferred embodiment, a capacitance for C is selected to be about 50 times a capacitor $C_4$ to obtain an integration factor of 1/(50 T), with a clock period (T) of about 64 ns. Of course, a different value for C could be selected according to need, clock speed, integration characteristics, and so forth.

A switch S2 is placed in communication with the integrator 12 (e.g., in communication with the negative terminal of the op-amp). Switch S2 switches a connection with the capacitor $C_4$. As shown in FIG. 3, a switch S3 gates a parallel arrangement between the $C_4$ capacitor and a variable capacitor $C_5$. A preferred structure for the $C_5$ variable capacitor is shown in FIG. 6.

A reference voltage $V_{ref}$ is input to the positive terminal of the op amp. $V_{ref}$ will be described in even further detail below. The current I is incrementally adjusted as a result of the varying voltage at the gate 11a of the transistor 11. The current I stabilizes when the voltage across the $C_4$ capacitor, at the end of each charging event, equals $V_{ref}$ (e.g., when the output of the integrator stabilizes or becomes constant).

A known current mirror 13 is arranged to be in communication with the $C_5$ capacitor, a switch S1, and the S3 switch, as shown in FIG. 3. Current mirror 13 is preferably a 1×mirror (e.g., one times a current source) that mirrors current I provided by current source 10. The switch S1 is arranged in parallel with the C, capacitor. As will be appreciated, NMOStransistors can be used as switches S1, S2 and S3. A known 3×current mirror 14 mirrors current source 10 to provide a current $I_R$, which is, e.g., preferably equal to 3·I. The 3×mirror accommodates the "3·I" requirement established by Equation 9. A voltage $V_{r2}$ is measured across resistors $R_4$ and $R_5$. Similarly, a voltage $V_{r1}$ is measured across the resistor $R_5$. Resistor $R_5$, as shown in FIG. 3, preferably has a resistance of "2.5·$R_1$," if $R_1$=$R_2$=$R_3$, which accommodates the resistive requirement established by Equation 9. Also, $C_5$ (FIG. 3) preferably equals 2·$C_2$ (FIG. 2) which accommodates the capacitance requirement as established by Equation 9.

A digital loop 15 provides $C_5$ with a digital code to vary its capacitance. The digital loop 15 preferably includes a plurality of shift registers or an up-down counter with appropriate logic, for example. A digital comparator 16 makes a comparison between $V_{r1}$ and $V_{ref}$. The output from comparator 16 is provided to the digital loop to shift the loop up or down. A digital comparator 17 makes a comparison between $V_{r2}$ nd $V_{ref}$. The output from comparator 17 is also provided to the digital loop.

The calibration circuit 3 continues to adjust the capacitance of $C_5$ until circuit 3 stabilizes. A stable circuit 3 is achieved when the current $I_R$ reaches a steady state. At this steady state point, $V_{r1}$ approximately equals $V_{ref}$. Preferably, the $C_1$ capacitor in the filter 2 is proportionally adjusted in response to the value of the $C_5$ capacitor, which caused the calibration circuit 3 to reach its steady-state, thus calibrating the filter 2. A preferred method and apparatus for adjusting the $C_1$ and $C_5$ capacitors are further discussed below. Preferred component and parameter values for the calibration circuit 3 are shown in Table 2, below.

TABLE 2

Preferred Calibration Circuit Parameters

| Component | Preferred Value |
| --- | --- |
| $R_4$ | 500 Ohms |
| $R_5$ | 25K Ohms |
| $C_4$ | 10 fF |
| $C_5$ | 400 fF |
| C | 500 fF |
| Transistor 11 | NMOS L = 1.8 μm, W = 6 μm |
| Comparators 16 and 17 | Offset · 10 mV Setting time · 10 μs |
| Current I | 40 μA |
| $V_{ref}$ | 1.5 volts |

Operational aspects of the calibration circuit will be further described with reference to FIGS. 4, 5a, 5b and 5c.

A 125 MHz system clock (not shown) is preferably divided by eight (8) in a known manner to produce at least three (3) 15.625 MHz clock signals $\phi_0$, $\phi_1$ and $\phi_2$. Of course, a different system clock in combination with different component values could be used to achieve similar results. Clock $\phi_0$ preferably drives (e.g., clocks) the digital loop 15.

Figure 4:
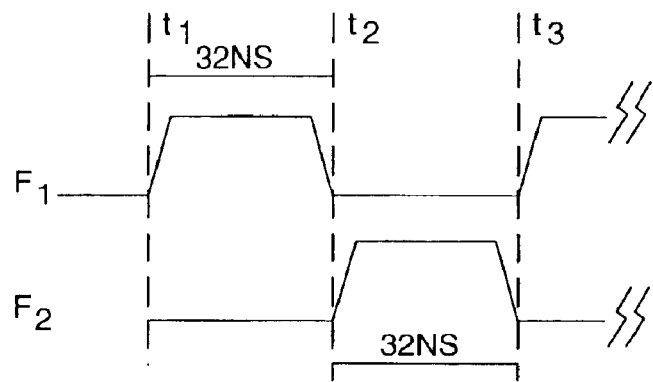
FIG. 4 is a timing chart of clocks $\phi_1$ and $\phi_2$.

A timing chart of clocks $\phi_1$ and $\phi_2$ is shown in FIG. 4. As will be readily appreciated, a 15.625 MHz clock has a 64-nanosecond period. As shown $\phi_2$ is inverted in a known manner from the $\phi_1$ signal. Clocks $\phi_1$ and $\phi_2$ drive switches S1, S2 and S3 as shown in Table 3, below.

TABLE 3

Switch Assignments

| Clock | Drives Switch |
| --- | --- |
| $\phi_1$ | $S_1$ |
| $\phi_1$ | $S_2$ |
| $\phi_2$ | $S_3$ |

Figure 5A:
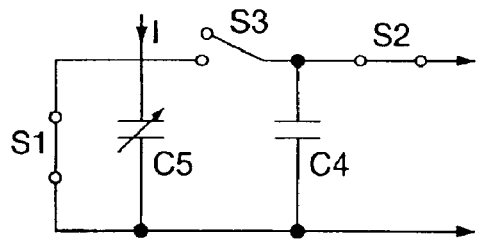
FIG. 5a is a circuit diagram illustrating a switch response of the FIG. 3 calibration circuit at a time t, as shown in FIG. 4.

In time period $t_1$ (shown in FIG. 4), $\phi_1$ is high and $\phi_2$ is low. Accordingly, switches S1 and S2 are closed while switch S3 is open, as shown in FIG. 5a. The voltage across $C_5$ is effectively drained during period $t_1$ by the short created through S1.

Figure 5B:
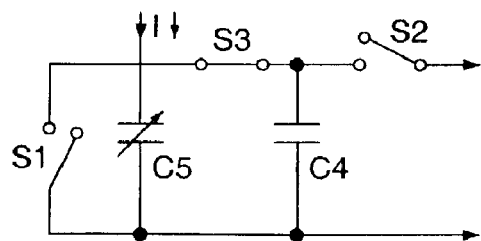
FIG. 5b is a circuit diagram illustrating a switch response of the FIG. 3 calibration circuit at a time $t_2$ as shown in FIG. 4.

In time period $t_2$ (shown in FIG. 4), $\phi_1$ is low and $\phi_2$ is high. Accordingly, switches S1 and S2 are open while switch S3 is closed, as shown in FIG. 5b. During the $t_2$ period, $C_4$ and $C_5$ are in parallel and are each charged by the constant current I. $C_4$ should be relatively small compared to $C_5$, so that $C_5$ does not glitch $C_5$ (e.g., cause a large charge step) when S3 closes. As will be appreciated, the final voltage across $C_4$ and $C_5$ can be determined from the capacitance, constant current I, and charging time (e.g., 32 nanoseconds).

Figure 5C:
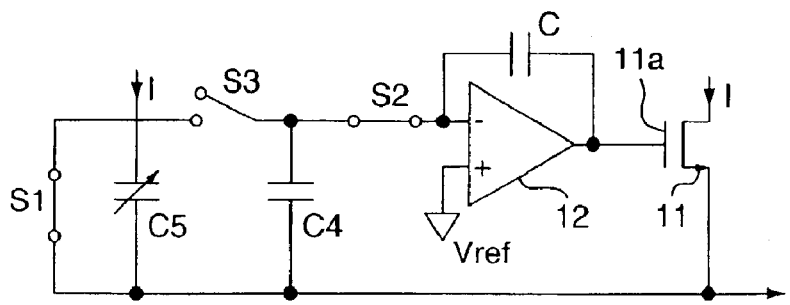
FIG. 5c is a circuit diagram illustrating a switch response of the FIG. 3 calibration circuit at a time $t_3$ as shown in FIG. 4.

The $\phi_1$ clock is high and the $\phi_2$ clock is low in time period $t_3$. In the $t_3$ period, as shown in FIG. 5c, switches S1 and S2 are closed while switch S3 is open. The short created by switch S1 effectively drains the voltage across $C_5$. The voltage across $C_4$ incrementally drives the integrator 12 during period $t_3$. The output of the integrator 12 is applied to gate 11a of the transistor 11, which causes an incremental change in the current I flowing through the transistor 11. As will be appreciated, the transconductance ($\Delta I/\Delta V$) of the transistor 11 sets the change in current I. This incremental change in current I is reflected to the current mirror 14. Accordingly, a corresponding incremental change in $I_R$ is produced (e.g., three (3) times the change to current I). The voltages $V_{r2}$ and $V_{r1}$ are also incrementally varied.

$V_{r1}$ is compared against $V_{ref}$ by the comparator 16. If $V_{r1}>V_{ref}$, the digital comparator outputs a digital 1. Such an output indicates that the capacitance of $C_5$ should be increased. When $V_{r1}>V_{ref}$, current I is too big (according to Equation 4) and, therefore, increasing the capacitance causes current I to decrease. Accordingly, the shift registers in the digital loop 15 are shifted up, thus incrementing a "digital code" generated by the registers. The digital comparator 16 outputs a digital 0 if $V_{r1}<V_{ref}$. Such an output indicates that the capacitance of $C_5$ should be decreased. When $V_{r1}<V_{ref}$, current I is too small (according to Equation 4) and, therefore, decreasing the capacitance of $C_5$ causes current I to increase. The digital loop 15 shifts the registers down in response to a zero (0) from comparator 16, thus adjusting down the digital code. As will be appreciated, $V_{ref}$ is canceled by letting $V_R=\Delta V_{Ct}$, as shown in Equation 7. Accordingly, an arbitrary value can be selected as the reference voltage $V_{ref}$. However, $V_{ref}$ is preferably at least equal to the bias voltage of the integrator op amp.

Voltage $V_{r2}$ is also compared against voltage $V_{ref}$ by the comparator 17. This comparison functions as a threshold to prevent the calibration of $C_5$ due to only minor changes in the current $I_R$. For example, the output of comparator 17 enables the registers to accept input from comparator 16 when $V_{r2} > V_{ref}$. In a preferred embodiment, $R_4$ is chosen such that $V(r_2) - V(r_1)$ is about 60 mV.

The output of the digital loop 15 (e.g., the digital code) calibrates the capacitance of $C_5$. In FIG. 6, C1 is a variable capacitor, where i corresponds to a respective capacitor. For example, when discussing the preferred structure of $C_5$, i equals "5." With reference to FIG. 6, $C_{\text{``5''}}$ includes a plurality of parallel capacitors $C_{5\text{-}b}$ and $C_{5\text{-}1}$ through $C_{5\text{-}20}$. Capacitors $C_{5\text{-}1}$ through $C_{5\text{-}20}$ are each communicating in series with a switch $S_{1\text{-}1}$ through $S_{i\text{-}20}$, respectively. Switches $S_{i\text{-}1}$ through $S_{i\text{-}20}$ can be realized with a CMOS n-channel transistor, for example, or other known switching components. Capacitors $C_{5\text{-}1}$ through $C_{5\text{-}20}$ preferably have the same capacitance (e.g., $C_{5\text{-}1} = C_{5\text{-}2} = C_{5\text{-}3}$, and so on). Incremental calibration steps can be made with these equivalent capacitors. Capacitor $C_{5\text{-}b}$ establishes a base capacitance for $C_5$. As such, $C_{5\text{-}b}$ is preferably not switched.

The digital loop 15 calibrates $C_5$ by providing a digital code to the parallel $C_5$ arrangement. The digital code contains a binary digit for each switch $S_{i\text{-}1}$ through $S_{i\text{-}20}$ (e.g., switches $S_{5\text{-}1}$ through $S_{5\text{-}20}$, with respect to the $C_5$ capacitor). On an initial calibration cycle, the digital loop supplies (e.g., communicates) a code of 00 ... 01 if $V_{r1} > V_{ref}$ (when the digital loop is enabled by the $V_{r2}$ comparison). Only switch $S_{5\text{-}20}$ is closed with this code. Accordingly, the equivalent $C_5$ capacitance is $C_{5\text{-}b} + C_{5\text{-}20}$. If the digital loop is subsequently incremented due to the comparison of $V_{r1}$ and $V_{r2}$ (each against $V_{ref}$) a digital code of 000 ... 11 is supplied to $C_5$. Switches $S_{5\text{-}19}$ (not shown) and $S_{5\text{-}20}$ are closed by this code. Accordingly, the equivalent $C_5$ capacitance is $C_{5\text{-}b} + C_{5\text{-}19} + C_{5\text{-}20}$. Capacitors $C_{5\text{-}1}$ through $C_{5\text{-}n}$ can be incrementally added in or subtracted from the equivalent $C_5$ capacitance based on the digital code to achieve stability of the calibration circuit 3. The maximum capacitance of the illustrated $C_5$ circuit is $C_{5\text{-}b} + \Sigma(C_{5\text{-}1}$ through $C_{5\text{-}20})$. Of course, a different number of parallel capacitors could be used according to the designed level of calibration. Also, the digital code could be generated and supplied in an alternative sequence, e.g., 100 ... 00, 110 ... 00, etc.

Capacitance values for $C_5$ are found to stabilize the calibration circuit 3. These values correspond to the digital code (e.g., a stabilizing code) provided by the digital loop 15. Preferred values for the parallel $C_5$ arrangement are shown in Table 4, below.

TABLE 4

Preferred Values for $C_5$

| Component | Value |
|---|---|
| $C_{5\text{-}b}$ | 240 fF |
| $C_{5\text{-}1}$–$C_{5\text{-}20}$ | 16 fF |

In this preferred embodiment, the $C_5$ capacitance is varied in increments of 16 fF. The nominal capacitance of 400 fF is achieved when ten capacitors (e.g., $C_{5\text{-}11}$ through $C_{5\text{-}20}$, each having a 16 fF capacitance) are included with the base capacitor $C_{5\text{-}b}$ (240 fF). In the preferred embodiment, ten additional capacitors (e.g., $C_{5\text{-}1}$ through $C_{5\text{-}10}$) can also be included if needed to reach a steady state. Of course, parallel capacitors can also be subtracted from the total $C_5$ capacitance when needed.

Preferably, $C_1$ is constructed in the manner shown in FIG. 6. In the preferred embodiment, $C_1$ includes a base capacitor $C_{1\text{-}b}$, which is equal to 480 fF, and a plurality of parallel capacitors $C_{1\text{-}1}$ through $C_{1\text{-}20}$, which are each equal to 32 fF. The nominal capacitance of 800 fF is achieved when ten capacitors are included with the base capacitor $C_{1\text{-}b}$.

The digital code is concurrently supplied to the $C_1$ capacitor of circuit 2 and the $C_5$ capacitor in circuit 3. Accordingly, the filter 2 is calibrated based on the stabilizing digital code of the calibration circuit 3.

In an alternative arrangement, the digital code is also supplied to the $C_2$ and $C_3$ capacitors. With this arrangement, the $C_2$ and $C_3$ capacitors are proportionally constructed with the format shown in FIG. 6. Preferably, in this alternative arrangement, the base capacitors (e.g., $C_{2\text{-}b}$ and $C_{3\text{-}b}$) each equal 120 fF and the switched parallel capacitors ($C_{2\text{-}1}$ through $C_{2\text{-}20}$ and $C_{3\text{-}1}$ through $C_{3\text{-}20}$) each equal 8 fF.

Of course, a new digital code can be automatically supplied to the filter 2 when the calibration circuit 3 determines that a new code is needed. For example, a change in temperature may cause a shift in current from an initial steady state. Hence, the calibration circuit 3 adjusts for process variance, as well as environmental changes.

Hence, an electronic calibration circuit and corresponding calibration methods have been described in detail herein.

While the present invention has been described with respect to what is presently considered to be the preferred embodiments, it will be understood that the invention is not limited to the disclosed embodiments. To the contrary, the invention covers various modifications and equivalent arrangements included within the spirit and scope of the appended claims. The scope of the following claims is to be accorded the broadest interpretation so as to encompass all such modifications and equivalent structures and functions.

For example, while a calibration circuit and low-pass filter are preferably constructed using integrated circuits, it will be appreciated by those skilled in the art that the inventive circuits and corresponding configurations could also be realized using discrete components.

Also, while preferred circuit configurations and component values have been described, those skilled in the art will appreciate that modifications could be made without deviating from the inventive methods and structures. For example, resistor and capacitor values could be changed according to need, circuit design, signal responses, and so forth. Also, the resistors $R_1$, $R_2$, and $R_3$ (as well as capacitors $C_2$ and $C_3$) can be varied with respect to each other. Corresponding components in the target circuit and calibration circuit 3 could be adjusted to reflect these types of changes. These and other such modifications are covered by the present invention.

As a further modification, the digital code generated by the digital loop 15 could be provided to a look-up table. The digital code could be used to index respective corresponding values (e.g., codes) for the variable $C_1$, $C_2$, $C_3$, and $C_5$ capacitors. The corresponding look-up table codes could be communicated to the corresponding variable capacitors. This arrangement may be particularly useful when non-linear relationships exist between the variable capacitors.

As an additional modification, some or all of the resistors (FIGS. 2 and 3) could include a variable resistance. These variable resistors could also include a different resistance with respect to each other. The variable resistors preferably include a resistive arrangement with switches. The digital code is then provided to the variable resistors, e.g., resistor $R_5$, for circuit calibration. In one embodiment, the digital code is first provided to the variable resistors $R_5$ and resistors $R_1$, $R_2$, and/or $R_3$ for calibration, and then the code is provided to the variable capacitors for finer calibration. The dashed line in FIG. 3 illustrates an embodiment where the digital code is provided to a variable $R_5$ resistor.

Also, whereas a filter has been shown as the target circuit, other target circuits could be calibrated as well, such as electrical circuits containing RC components, where the target design parameters depend on the RC product.

What is claimed is:

1. A calibration circuit comprising:

a first capacitor comprising:

a plurality of parallel capacitors, wherein at least one parallel capacitor of the plurality of parallel capacitors communicates with a switch, and the switch is operated with a digital signal; and a digital loop including an output in communication with at least the switch of the one parallel capacitor, the digital loop generating a digital signal and communicating the digital signal to at least the switch, wherein the digital signal is varied to reach a steady-state for the calibration circuit.

2. The calibration circuit according to claim 1, further comprising a first resistor including a plurality of resistive elements, wherein at least one resistive element of the plurality of resistive elements communicates with a second switch, and the second switch is operated with the digital signal, and wherein the output of the digital loop is in communication with the second switch.

3. The calibration circuit according to claim 2, further comprising an output including the digital signal.

4. A calibration circuit comprising:

first means for providing capacitance comprising:

a plurality of parallel means for providing;

capacitance, wherein at least one parallel providing capacitance means communicates with means for switching, and the switching means is operated with a digital signal; and means for generating a digital signal including an output in communication with at least the switching means of the one parallel means for providing capacitance, the generating means generating a digital signal and communicating the digital signal to at least the switching means, wherein the digital signal is varied to reach a steady-state for the calibration circuit.

5. The calibration circuit according to claim 4, further comprising a first resistor including a plurality of resistive elements, wherein at least one resistive element of the plurality of resistive elements communicates with a second switch, and the second switch is operated with the digital signal, and wherein the output of the digital loop is in communication with the second switch.

6. The calibration circuit according to claim 5, further comprising an output including the digital signal.

* * * * *

UNITED STATES PATENT AND TRADEMARK OFFICE
CERTIFICATE OF CORRECTION

PATENT NO. : 6,885,181 B1
APPLICATION NO. : 10/379260
DATED : April 26, 2005
INVENTOR(S) : Pierte Roo It is certified that error appears in the above-identified patent and that said Letters Patent is hereby corrected as shown below:

Column 4, Line 46: Delete "preferably" and insert -- preferable --
Column 5, Line 20: Delete "C," and insert -- $C_5$ --
Column 6, Line 61: Delete "$\Delta V_{ct}$" and insert -- $\Delta V_{c1}$ --
Column 7, Line 6: Delete "C1" and insert -- $C_1$ --
Column 7, Line 12: Delete first occurrence of "$S_{1-1}$" and insert -- $S_{i-1}$ --
Claim 4, Line 3: Delete ";" after "providing"

Signed and Sealed this

Twelfth Day of September, 2006

JON W. DUDAS
*Director of the United States Patent and Trademark Office*